United States Patent
Pilz et al.

(10) Patent No.: US 7,387,395 B2
(45) Date of Patent: Jun. 17, 2008

(54) OPTICAL UNITS

(75) Inventors: Manfred Pilz, Oberkochen (DE); Christian Muenster, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 144 days.

(21) Appl. No.: 11/015,696

(22) Filed: Dec. 17, 2004

(65) Prior Publication Data

US 2005/0134973 A1    Jun. 23, 2005

(30) Foreign Application Priority Data

Dec. 18, 2003    (DE) ................ 103 59 576

(51) Int. Cl.
G02B 7/182    (2006.01)
G02B 5/08    (2006.01)
G02B 7/02    (2006.01)

(52) U.S. Cl. .............. 359/871; 359/838; 359/811

(58) Field of Classification Search ........ 359/811, 359/819, 830, 831, 833, 838, 869, 871
See application file for complete search history.

(56) References Cited

U.S. PATENT DOCUMENTS

| | | |
|---|---|---|
| 6,445,515 B2 | 9/2002 | Moennig |
| 6,466,380 B2 | 10/2002 | Bischoff |
| 6,538,829 B2 | 3/2003 | Rau et al. |
| 6,552,862 B2 | 4/2003 | Dieker |
| 6,580,570 B2 | 6/2003 | Becker et al. |
| 6,594,093 B2 | 7/2003 | Moeller et al. |
| 6,603,615 B2 | 8/2003 | Melzer et al. |
| 6,667,255 B2 | 12/2003 | Hexels |
| 6,667,839 B2 | 12/2003 | Hartmaier et al. |
| 6,715,889 B2 * | 4/2004 | Nishima et al. ....... 353/101 |
| 6,717,742 B2 | 4/2004 | Weber |
| 6,727,984 B2 | 4/2004 | Becht |
| 6,733,369 B1 | 5/2004 | Stacklies et al. |
| 6,768,600 B2 | 7/2004 | Dieker |
| 6,791,768 B2 | 9/2004 | Rau |
| 6,798,588 B2 | 9/2004 | Vogt |
| 6,816,325 B1 | 11/2004 | Becker et al. |
| 6,825,914 B2 | 11/2004 | Schroeder et al. |
| 6,829,107 B2 | 12/2004 | Osterried |
| 6,844,994 B2 | 1/2005 | Melzer et al. |
| 2002/0021503 A1 * | 2/2002 | Osterried ............ 359/819 |

* cited by examiner

*Primary Examiner*—Ricky Mack
*Assistant Examiner*—Jack Dinh
(74) *Attorney, Agent, or Firm*—Wells St. John, P.S.

(57) ABSTRACT

In a method for producing an optical unit having an optical element deviating from a circular shape, for an optical imaging system, in particular for a projection objective in semiconductor lithography in the EUV region, a supporting part is provided, which is provided with reference surfaces for adjustment in the optical system, in accordance with which the optical element is connected to the supporting part. Subsequently, there is fixed relative to the optical element a zero point which forms a reference point with a zero point fixed in the optical system during installation of the optical unit in the optical system.

11 Claims, 2 Drawing Sheets

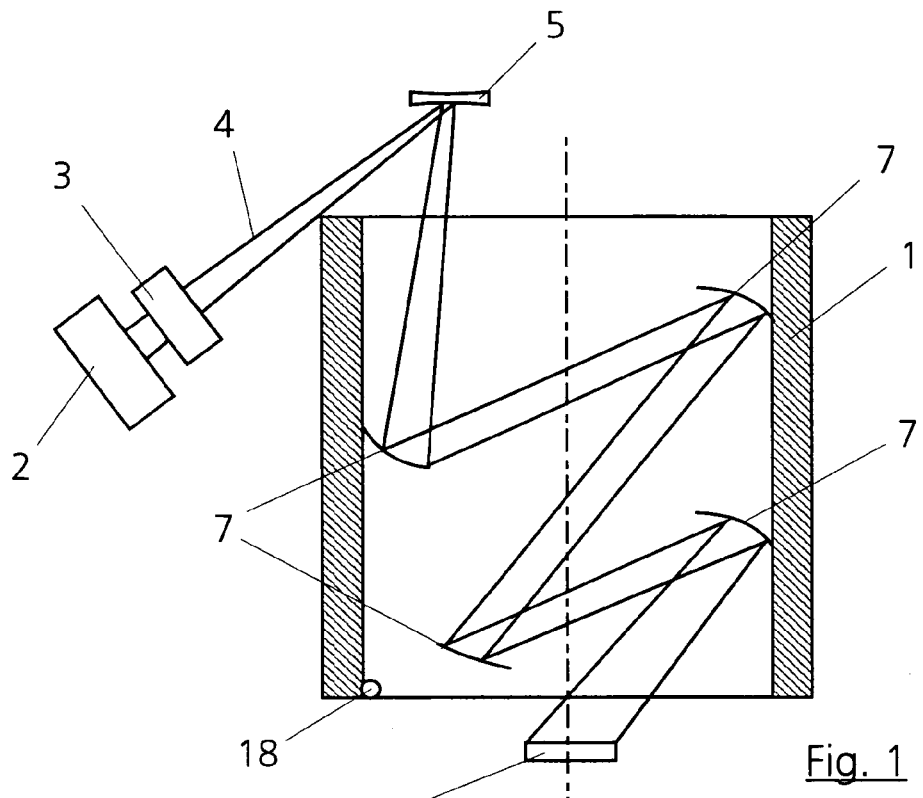
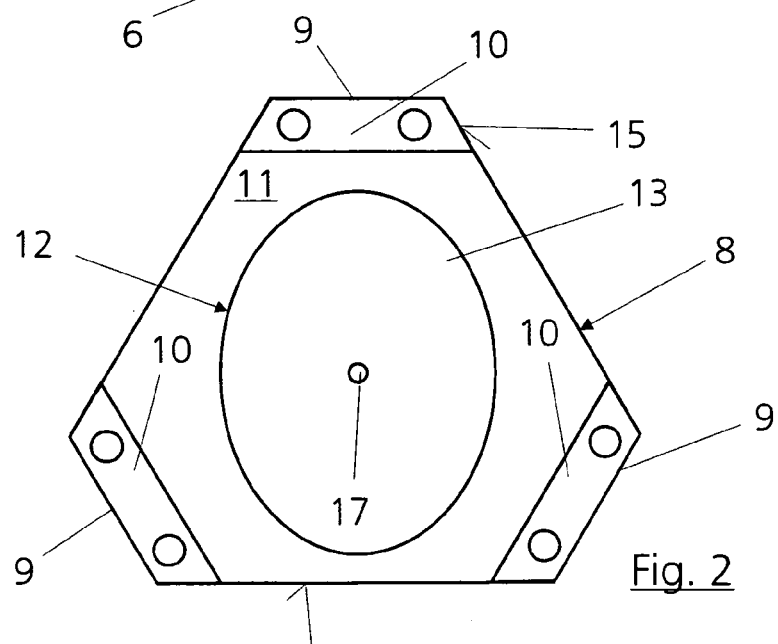
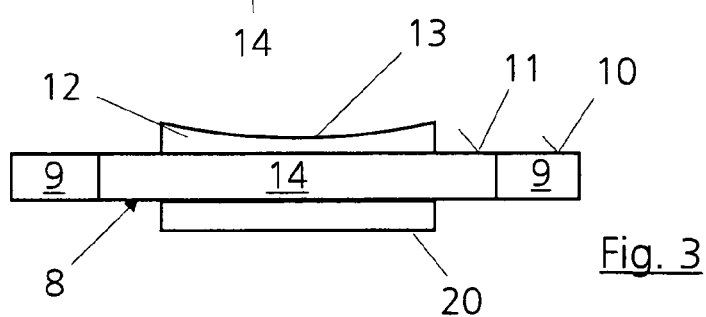
Fig. 1
Fig. 2
Fig. 3

OPTICAL UNITS

CROSS REFERENCE TO RELATED APPLICATION

This application relates to and claims priority to corresponding German Patent Application No. 103 59 576.7, which was filed on Dec. 18, 2003, and which is incorporated by reference herein.

BACKGROUND OF THE INVENTION

1. Field of the Invention

The invention relates to a method for producing an optical unit having an optical element deviating from a circular shape, for an optical imaging system, in particular for a projection objective in semiconductor lithography in the EUV region.

2. Description of the Related Art

The invention also relates to an optical unit having an optical element for an optical imaging system.

Projection objectives in semiconductor lithography for producing semiconductor elements which operate in the EUV region at wavelengths of around 11 to 13 nm are subject to extremely high requirements placed on the optical elements. This applies, for example, firstly to the useful optical surface within a particular specification (fitting, roughness) with reference to the production and, secondly, also to a later adjustment with reference to a very exact installation position in an objective. This relates, in particular, to mirrors which are required instead of lenses given the very short wavelengths mentioned above. Since the later adjustment with reference to the position of the useful optical surface requires this position to be known down to a few µ, there is the need to provide on the optical unit, for example the mirror, a number of reference surfaces which then form reference surfaces—appropriately referred to a zero point—for installation. A very high economic outlay is required in order to fulfill the requisite accuracy specifications for the reference surfaces. The abovementioned problems are even greater given an optical element deviating from the circular shape, for example a reflecting element or a prism.

SUMMARY OF THE INVENTION

It is therefore the object of the present invention to provide a method for producing an optical unit having an optical element deviating from the circular shape, in particular a mirror, and an optical unit produced in accordance therewith, in the case of which method it is possible to implement the required accuracies and the exact adjustment with reference to installation in an objective or to do so with a low outlay.

According to the invention, this is achieved by means of a method in which the optical element deviating from the circular shape is provided with a supporting part which is provided with reference surfaces for adjustment to the optical system, in accordance with which the optical element is connected to the supporting part to form an optical unit, and there is fixed relative to the optical element a zero point which forms a reference point with a zero point fixed in the optical system during installation of the optical unit in the optical system.

According to the invention, at a location fixed by the user a zero point is now fixed "somewhere" on the optical element deviating from a circular shape, for example in the middle of a spherical or aspheric surface of a mirror. The reference surfaces are then referred to his zero point, the values obtained then also being given correspondingly for installation in an optical system, for example an objective, and it becoming possible in this way for the optical element, for example an aspheric surface, to be related exactly to another zero point in the optical system.

One of the essential features of the invention resides in the fact that the optical unit is not produced monolithically from one part with the optical element and the supporting part, but that it comprises a number of parts, at least two parts, specifically the supporting part and the actual optical element. Here, the optical element can likewise be formed form a basic body on which the actual optical element deviating from the circular shape is then constructed—for example a mirror in the form of an aspheric which is formed from a so-called parent.

Because the optical unit is split into a number of individual parts, the individual parts can in each case be separately produced with the required high accuracy and, if appropriate, with the required reference surfaces.

The following reference surfaces can be provided in one very advantageous design of the invention:

a) at least three coplanar reference surfaces which form a reference plane, b) a first locating edge, lying at an angle to the coplanar reference surfaces, of the supporting part, and c) a second locating position by means of which translatory displacements along the first locating edge are avoided.

A reference plane is fixed in a first step owing to the at least three coplanar reference surfaces via which it is also possible later, if appropriate, to make a fastening with or in the optical system. This reference plane is advantageously the same plane on or at which the actual optical element for example a mirror, is fastened. This can be performed, for example, by wringing to surfaces of correspondingly high precision. The reference plane can lie perpendicular to the z-axis (optical axis).

The first locating edge, which preferably lies perpendicular to the coplanar fastening surfaces, has the effect of precluding rotations on the reference plane formed by the coplanar fastening surfaces, and/or of fixing the position on the reference plane.

The second locating point, which is preferably likewise a locating edge, then has the effect that translatory displacements along the first locating edge are avoided in a last step. In this way, the position of the optical element is fixed exactly with reference to the reference surfaces and to the zero point of the optical element.

Further advantageous refinements and developments of the invention emerge from the remaining subclaims and from the following exemplary embodiment described in principle with the aid of the drawings.

BRIEF DESCRIPTION OF THE DRAWINGS

FIG. 1 shows a diagrammatic illustration of a projection objective having a number of mirrors as optical elements;

FIG. 2 shows a top view of a mirror as optical unit having a supporting part;

FIG. 3 shows a side view of the mirror according to FIG. 2;

DETAILED DESCRIPTION

Figure 4:
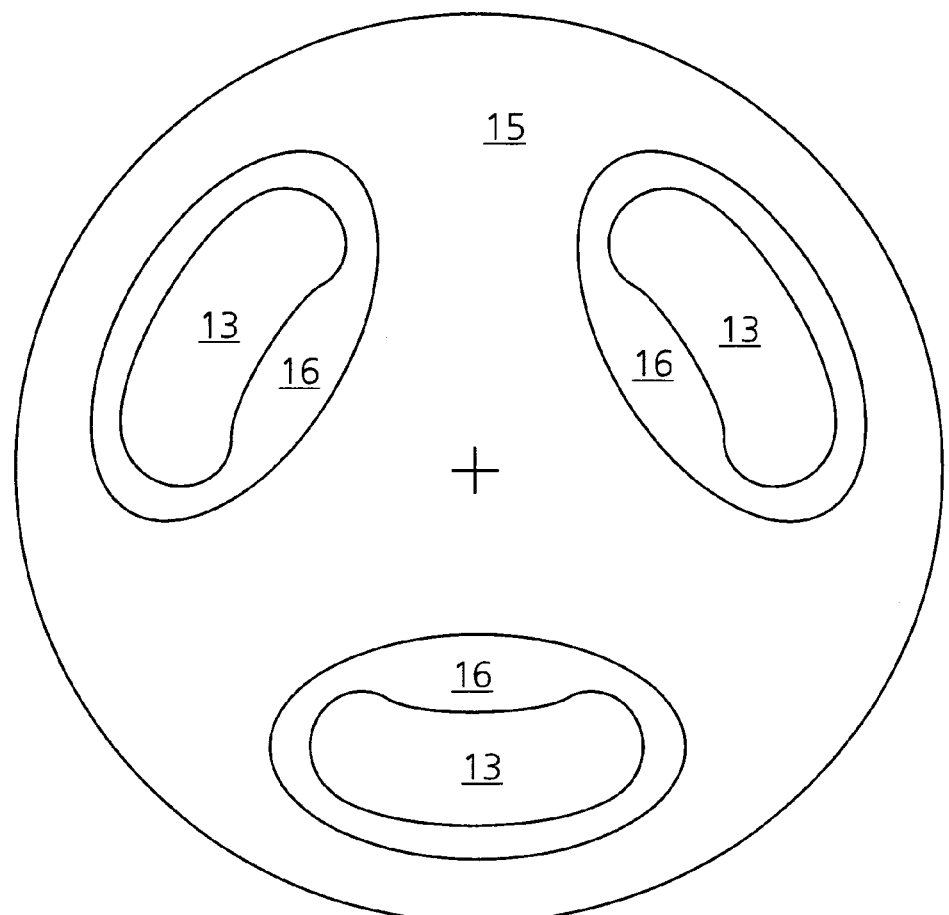
FIG. 4 shows a top view of a parent.

As optical system, the projection objective 1 illustrated in FIG. 1 is provided for producing semiconductor elements by semiconductor lithography in the EUV region. Exposure is served by a light source, for example a plasma source 2, which transmits exposure beams 4 onto a mask (reticle) 5 via an illumination system 3. Formed in the mask 5 is the structure which images the beams on a wafer 6 on a correspondingly reduced scale after passage through the objective 1. The exposure beam 4 is reflected in a known way in the projection objective 1 via a number of mirrors 7 as optical units before it strikes the wafer 6. The mirrors 7, which deviate from a circular shape, are respectively connected to the housing of the objective 1 via a supporting part 8 in a way not illustrated in more detail, for example via screws (see bore holes in FIG. 2). The supporting part 8 is provided for this purpose with three fastening sections 9 which are arranged distributed over the circumference and in each case have fastening surfaces 10. The fastening surfaces 10 of the fastening sections 9 simultaneously form reference surfaces and are coplanar with one another for this purpose, that is to say they lie in the same plane. This plane is simultaneously also a plane surface 11, produced with high accuracy, of the supporting part 8. Laid onto the plane surface 11 of the supporting part 8 is a basic body 12 in which a reflecting surface 13 is formed as optical element on the side averted from the supporting part 8. The underside of the basic body 12 is produced with a correspondingly high accuracy, as a result of which it can be connected to the supporting part 8 by wringing.

Of course, it is not mandatory for the reference surfaces to form the fastening surfaces at the same time. If need be, these can also together form a reference plane at another location. However, the reference surfaces should advantageously be simultaneously processed with the fastening surfaces 10 in this case. For this purpose, the reference surfaces 10 should then lie as directly as possible adjacent to the fastening surfaces 10.

Instead of forming the reflective surface 13 (aspheric) in the basic body 12, it is also possible to provide as a freeform surface a separate reflecting surface 13 placed on the basic body 12. It is to be ensured in this case that the underside of the aspheric has or is given a plane surface of correspondingly high accuracy via which the connection to the basic body 12 is then performed.

Instead of an individual off-axis segment of an ellipse, the top side of the reflecting surface 13, specifically the aspheric surface, can be produced from a parent 15, as may be seen from FIG. 4. For this purpose, the required off-axis segments are cut out of the parent 15 as reflecting surfaces 13 and correspondingly prepared on their undersides for wringing. The advantage of this method of production consists, inter alia, in that the "overflow" 16 of importance for the production can be intrinsically present on the optical surfaces. This means that there is no need to reserve any polishing overflows, which can amount to up to 9 mm, for the production of the useful optical surface. The mirror 13 can therefore be produced in a much more compact fashion, and so an installation space which is generally a tight one can be utilized in a more optimal fashion.

The reference surfaces on the supporting part 8 serve for determining the position of the reflecting surface or the aspheric 13. As mentioned, here the first reference plane is formed by the three coplanar fastening surfaces 10. The position in the reference plane with reference to an axis, for example the x-axis, is determined by a first locating edge 14 which is formed by a long side of the supporting part 8.

Translatory displacements along the locating edge 14 are avoided and/or the last degree of freedom of the supporting part 8 is determined by a further second locating position in the form of a locating edge 15 which lies at an angle to the locating edge 14.

The system can be adjusted with the aid of the abovementioned reference surfaces, specifically the fastening surfaces 10, the two locating edges 14 and 15. For this purpose, a zero point 17 is fixed in the middle of the aspheric surface 13, for example, the position of the aspheric surface with reference to the reference surfaces thereby being known. The values obtained therefrom are then passed on correspondingly to the objective 1 via the supporting part 8 as optical units for the purpose of installing the optical element in this system, this zero point being fixed relative to a zero point 18 in the objective, which can likewise be freely fixed previously in a corresponding way. The zero point 18 in the objective can be positioned, for example, at a specific location on the inside of the housing of the objective 1, or else at another location on the optical axis.

The result of this is to refer the optical element, in this case the aspheric surface 13, with the zero point 17 previously fixed during production to the zero point 18 in the objective, the result being not only that a correspondingly accurate adjustment is possible, but also that an exact reproducibility is achieved in the event of removal and subsequent reinstallation.

Three reference surfaces can be used to make contact in a simple way with the supporting part 8 for installation in the objective 1, and thus adjust it exactly as appropriate.

For reasons of stability, it can be provided that an underpart 20 is arranged on the side of the supporting part 8 averted from the optical element. It is also possible in this way to minimize stresses which occur, for example, by coatings in the optical element. The underpart 20 can likewise be connected to the supporting part 8 by wringing. Of course, this requires the mutually facing surfaces of the supporting part 8 and the underpart 20 to be produced with correspondingly high precision.

All the parts of the optical unit, which can therefore consist of the aspheric 13, the supporting part 8 and the underpart 20, will advantageously be produced from the same material. Zerodur, for example, is suitable as material for the optical element, since it has a very low coefficient of thermal expansion. Likewise suitable is ULE (from the firm of Corning).

Two methods for producing an optical unit are described below in principle by way of example:

The supporting part 8 is produced in a first step. Subsequently, the basic body 12 is produced, after which the basic body 12 is connected to the supporting part 8. Subsequently, the surface of the actual optical element 13 (reflecting surface or aspheric surface) is processed on the basic body 12.

In a second method, the supporting part 8 is likewise produced in a first step. Subsequently, a parent 15 is produced and appropriately processed, in which case after being machined from the parent 15 in accordance with the desired off-axis segment of an ellipse, a reflecting surface 13 is cut out. Subsequently, the basic body 12 or the supporting part 8 is connected to the cut-out axial segment of an ellipse.

Figure 5:
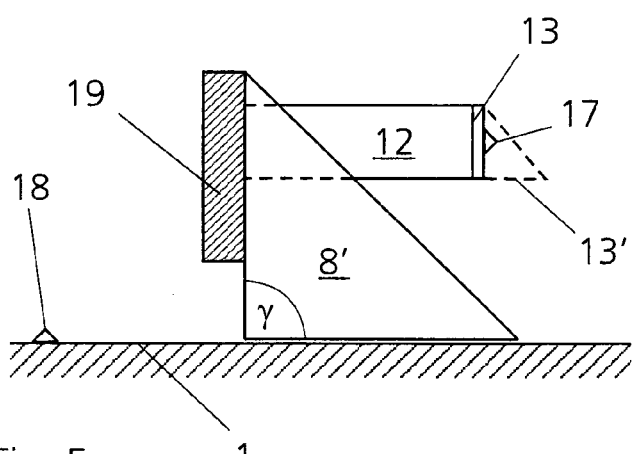
FIG. 5 shows a partial section through an optical unit having a prism.

FIG. 5 shows in a partial section an embodiment of an optical unit having a cylindrical basic body 12 on whose front end face the optical element 13 is arranged.

Figure 6:
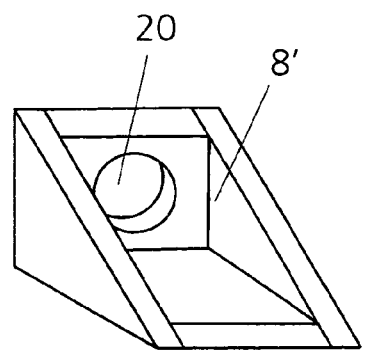
FIG. 6 shows a perspective view of a supporting body from the prism according to FIG. 5.

For the purpose of connection to the supporting part 8', the basic body 12 is provided with an adapter 19 which is connected to the basic body 12 on the end face thereof averted from the optical cement 13. The basic body 12 is mounted in a cutout 20 in the supporting body 8', the supporting body 8' in this case having the form of a prism, as is to be seen from the perspective illustration in FIG. 6. The adapter 19 with the basic body 12 lies on one of the two sides, arranged at right angles to one another, on the supporting body 8'. This is the side with the cutout 20 in which the adapter 12 is mounted. Of course, the cutout 20 need not be circular. Rather, it is to be adapted to the cross section of the basic body 12 which, of course, likewise need not be cylindrical, but can, for example, have a rectangular shape.

The optical element 13 can, for example, be an aspheric which is, for example, formed from the parent 15 illustrated in FIG. 4.

Likewise a prism 13' can be arranged as optical element on the front side face of the basic body 12, as illustrated by dashes in FIG. 5.

The aim of the embodiment according to FIG. 5 is to keep angular errors in the zero point 17 of the optical element 13 with reference to the zero point 18 in the optical system smaller than 10 seconds of angle, preferably smaller than 3 seconds of angle, the zero point 17 again being a zero point selected arbitrarily on the optical element 13, and "18" being the zero point arbitrarily fixed in the optical system 1. In this way, an exact and reproducible assignment results once more upon installation of the optical element 13.

The adapter 19 is connected to the basic body 12 and the supporting part 8' by wringing, for example. The optical unit according to FIG. 5 with the basic body 12, the adapter 19 and the supporting body 8' has reference surfaces in the same way as the exemplary embodiment according to FIGS. 1 to 3 with the reflecting surface 13 as optical element. However, these are not illustrated for reasons of clarity.

The supporting body 8' is produced in a first step in the method of production illustrated by way of example below, and in this case angular errors should be γ<3" seconds of angle, preferably <1 second of angle. The flatness error should be <10 μ, preferably <1 μ. Here, the angle γ is the angle of direct angularity of the prismatic supporting body 8'. The plan-parallel adapter 19 is subsequently produced, after which the basic body 12 is connected, for example by wringing, to the adapter 19 and, at the same time, also to the supporting body 8'.

If required, the individual parts of the optical unit can also be interconnected in another way such as, for example, by bonding. However, wringing will generally be preferred, in order to avoid introducing adhesive stresses.

What is claimed is:

1. An optical unit comprising an optical element deviating from a circular shape, for an optical imaging system, and a supporting part which is provided with reference surfaces for adjustment to said optical imaging system, said supporting part being connected to said optical element, and said reference surfaces being referred to a zero point relative to said optical element which forms a reference point with a zero point fixed in said optical imaging system during installation of said optical unit in the optical imaging system;
wherein the reference surfaces are provided on said supporting part and comprise at least three coplanar reference surfaces which form a reference plane;
a first locating edge, lying at an angle to the coplanar reference surfaces, of said supporting part;
a second locating position by means of which translatory displacements along the first locating edge are avoided;
wherein said supporting part is provided with an underpart on the side avert from said optical element;
wherein a basic body with a plane surface is provided via which said basic body is connected to said supporting part, and wherein said basic body has a reflecting surface as the optical element; and
wherein the supporting part, the reflecting surface and the underpart comprise individual parts, and wherein said individual parts of said optical unit are connected to one another by wringing.

2. The optical unit according to claim 1, wherein said three reference surfaces forming a reference plane lie perpendicular to the optical axis.

3. The optical unit according to claim 1, wherein said first locating edge lies perpendicular to the reference plane.

4. The optical unit according to claim 1, wherein said second locating position is constructed as a locating edge.

5. The optical unit according to claim 1, wherein said reference surfaces simultaneously form fastening surfaces to which said optical unit with the optical system is connected.

6. The optical unit according to claim 5, wherein said reference surfaces lie adjacent to said fastening surfaces.

7. The optical unit according to claim 1, wherein the supporting part and the underpart comprise individual parts, and wherein said individual parts are formed from the same material, in particular a material of very low thermal expansion.

8. The optical unit according to claim 1, wherein the shape of the optical element is relative a cross-sectional plane of the optical element that is oriented perpendicularly to an optical axis of the optical element.

9. An optical unit comprising an optical element deviating from a circular shape, for an optical imaging system, and a supporting part which is provided with reference surfaces for adjustment to said optical imaging system, said supporting part being connected to said optical element, and said reference surfaces being referred to a zero point relative to said optical element which forms a reference point with a zero point fixed in said optical imaging system during installation of said optical unit in the optical imaging system; and
wherein a basic body with a plane surface is provided via which said basic body is connected to said supporting part, and wherein said basic body has a reflecting surface as the optical element.

10. The optical unit according to claim 9, wherein said reflecting surface is formed in said basic body as a freeform numerous surface.

11. The optical unit according to claim 9, wherein said reflecting surface is formed from a parent from which said reflecting surface is cut out.

* * * * *

UNITED STATES PATENT AND TRADEMARK OFFICE
CERTIFICATE OF CORRECTION

PATENT NO. : 7,387,395 B2  
APPLICATION NO. : 11/015696  
DATED : June 17, 2008  
INVENTOR(S) : Christian Muenster and Manfred Pilz Page 1 of 1

It is certified that error appears in the above-identified patent and that said Letters Patent is hereby corrected as shown below:

Col. 1, line 67 -
Replace "surfaces are then referred to his zero point, the values"
With --surfaces are then referred to this zero point, the values--

Col. 2, line 12 -
Replace "the optical element can likewise be formed form a basic body"
With --the optical element can likewise be formed from a basic body--

Signed and Sealed this

Sixth Day of January, 2009

JON W. DUDAS
*Director of the United States Patent and Trademark Office*